(12) United States Patent
Norrie

(10) Patent No.: US 8,069,392 B1
(45) Date of Patent: Nov. 29, 2011

(54) ERROR CORRECTION CODE SYSTEM AND METHOD

(75) Inventor: Christopher I. W. Norrie, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 1078 days.

(21) Appl. No.: 11/873,357

(22) Filed: Oct. 16, 2007

(51) Int. Cl.
*H03M 13/00* (2006.01)

(52) U.S. Cl. ........................................... 714/758

(58) Field of Classification Search .................. 714/758, 714/767
See application file for complete search history.

(56) References Cited

U.S. PATENT DOCUMENTS

| | | | |
|---|---|---|---|
| 3,648,239 | A | 3/1972 | Carter et al. |
| 3,825,893 | A | 7/1974 | Bossen et al. |
| 4,450,561 | A | 5/1984 | Gotze et al. |
| 5,481,566 | A * | 1/1996 | Kulesa ........................... 375/259 |
| 5,537,427 | A * | 7/1996 | Chen .............................. 714/781 |
| 5,539,754 | A | 7/1996 | Zuras, Jr. et al. |
| 5,546,409 | A | 8/1996 | Karasawa |
| 5,719,884 | A | 2/1998 | Roth et al. |
| 6,331,948 | B2 | 12/2001 | Kasai et al. |
| 6,351,832 | B1 * | 2/2002 | Wei ................................ 714/701 |
| 7,171,591 | B2 | 1/2007 | Chen |
| 7,231,582 | B2 * | 6/2007 | Worley ......................... 714/773 |
| 7,231,585 | B2 | 6/2007 | Vainsencher et al. |
| 7,243,290 | B2 * | 7/2007 | Slavin ........................... 714/763 |
| 7,243,293 | B2 * | 7/2007 | Chen .............................. 714/781 |
| 7,278,085 | B1 * | 10/2007 | Weng et al. ................... 714/766 |
| 7,290,083 | B2 * | 10/2007 | Shoham et al. ............... 711/108 |
| 7,350,131 | B2 * | 3/2008 | Trainin ......................... 714/758 |

OTHER PUBLICATIONS

Andrew E. Phelps, "Constructing an Error Correcting Code," University of Wisconsin, Madison, Nov. 9, 2006.
"Error Correcting Codes," Hacker's Delight, Chapter 15, available at http://www.hackersdelight.org/ecc.pdf, Apr. 18, 2005.

* cited by examiner

*Primary Examiner* — James C Kerveros
(74) *Attorney, Agent, or Firm* — Kenneth Glass; Stanley J. Pawlik; Glass & Associates

(57) ABSTRACT

An error correction code system includes an error correction code generator for generating an error correction code based on a data unit and an error detector for detecting at least one bit error in the data unit based on the error correction code. The error correction code generator includes logic circuits for generating check bits in the error correction code. The error detector includes logic circuits for identifying any data bits of the data unit having a bit error based on the error correction code. The logic circuits in the error correction code generator and the error detector are derived from group codes separated from each other by a hamming distance and having a same population count. The error correction code system may also include an error corrector for correcting error bits in the data unit.

25 Claims, 12 Drawing Sheets

ERROR CORRECTION CODE SYSTEM AND METHOD

BACKGROUND

Error correction codes are often used in electronic systems for detecting and correcting data errors. Such an electronic system typically includes circuits for generating an error correction code based on data, detecting bit errors in the data based on the error correction code, and correcting bit errors in the data based on the error correction code. In many electronic systems, circuits for detecting and correcting bit errors based on error correction codes are in critical paths of the electronic systems. Consequently, these circuits for detecting and correcting bit errors limit data processing rates of the electronic systems.

In some electronic systems, circuits generate error correction codes based on a hamming code. In these electronic systems, circuits generate a minimum number of check bits of an error code for detecting a number of bit errors in data and correcting a number of the bit errors. For example, such a circuit may be capable of detecting and correcting a single bit error in the data as well as detecting a double bit error in the data. The number of bit errors detectable and correctable by these circuits depends on a minimum hamming distance between group codes associated with data bits of the data. The minimum number of check bits needed for detecting the number of bits errors in these electronic systems depends upon the number of data bits in the data and may also depend upon the minimum hamming distance. Although using a minimum number of check bits for detecting and correcting errors in data reduces storage requirements for an error correction code, faster circuits are needed to meet ever-increasing data processing rates of electronic systems.

In light of the above, a need exists for an improved error detection circuit. A further need exists for high-speed error detection and correction circuits.

SUMMARY

In various embodiments, an error correction code system includes an error correction code generator for generating an error correction code based on a data unit and an error detector for detecting at least one bit error in the data unit based on the error correction code. The error correction code generator includes logic circuits for generating check bits of the error correction code. The error detector includes logic circuits for identifying one or more data bits of the data unit having a bit error based on the error correction code. The logic circuits in the error correction code generator and the error detector are derived from group codes separated from each other by a hamming distance and having a population count. Variance among the population counts of the group codes is minimized to reduce propagation delays of the logic circuits in the error detector. In this way, the speed of the error detector is increased. In some embodiments, the group codes have a same population count, which further reduces propagation delays of the logic circuits in the error detector.

A method, in accordance with one embodiment, includes determining a hamming distance for detecting a number of bit errors in a data unit including a number of data bits. The method also includes determining a number of check bits of an error correction code based on the number of data bits for detecting up to the number of bit errors in the data unit. The method further includes selecting group codes separated from each other by the hamming distance. Each of the group codes includes data values and a same population count indicating a number of the data values having a same logic state in the group code. Additionally, the method includes determining logic equations based on the group codes for identifying at least one data bit having a bit error in the data unit.

A method, in accordance with one embodiment, includes determining a minimum hamming distance for detecting a number of bit errors in a data unit comprising a number of data bits. The method also includes determining a minimum number of check bits of an error correction code based on the number of data bits for detecting up to the number of bit errors in the data unit. The method further includes selecting a number of check bits greater than the minimum number of check bits. Additionally, the method includes determining a first plurality of group codes separated from each other by the minimum hamming distance. Further, the method includes selecting a second plurality of group codes from the first plurality of group codes. Each group code of the second plurality of group codes includes data values and a population count indicating a number of the data values having a same logic state in the group code. Additionally, the second plurality of group codes includes a plurality of check codes. Each of the check codes includes a data value of each group code of the second plurality of group codes and includes a population count indicating a number of data values in the check code having a same logic state. The method also includes determining a first plurality of logic equations based on the plurality of check codes for generating a plurality of check bits of the error correction code and determining a second plurality of logic equations based on the second plurality of group codes for identifying at least one data bit having a bit error in the data unit.

A system, in accordance with one embodiment, includes an error correction code generator and an error detector coupled to the error correction code generator. The error correction code generator is configured to generate a first error correction code including a number of check bits based on a data unit. Additionally, the error correction code generator includes a first plurality of logic circuits for generating the check bits in the first error correction code. The error detector is configured to generate a syndrome having a number of syndrome bits based on the first error correction code and a second error correction code. Additionally, the error detector includes a second plurality of logic circuits each having a number of inputs being less than the number of check bits of the first error correction code for receiving at least one syndrome bit of the syndrome. Each logic circuit of the second plurality of logic circuits is configured to indicate whether a corresponding data bit in the data unit has a bit error.

A method, in accordance with one embodiment, includes generating a first error correction code having a number of check bits based on a data unit and generating a syndrome comprising a number of syndrome bits based on the first error correction code and a second error correction code. The method also includes generating a bit error indictor based on at least one syndrome bit of the syndrome for detecting a bit error in the data unit. The at least one syndrome bit has a number of syndrome bits being less than the number of check bits in the first error correction code.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, an error correction code system includes logic circuits for generating an error correction code based on a data unit and detecting and correcting bit errors in the data unit. The logic circuits are derived from group codes separated from each other by a hamming distance and having a same population count. Because the group codes have the same population count, propagation delays of the logic circuits for detecting and correcting bit errors is reduced. In other embodiments, population counts of the group codes vary. In these embodiments, a variance among the population counts of the group codes is minimized, which reduces propagation delays of the logic circuits for detecting and correcting bit errors.

Figure 1:
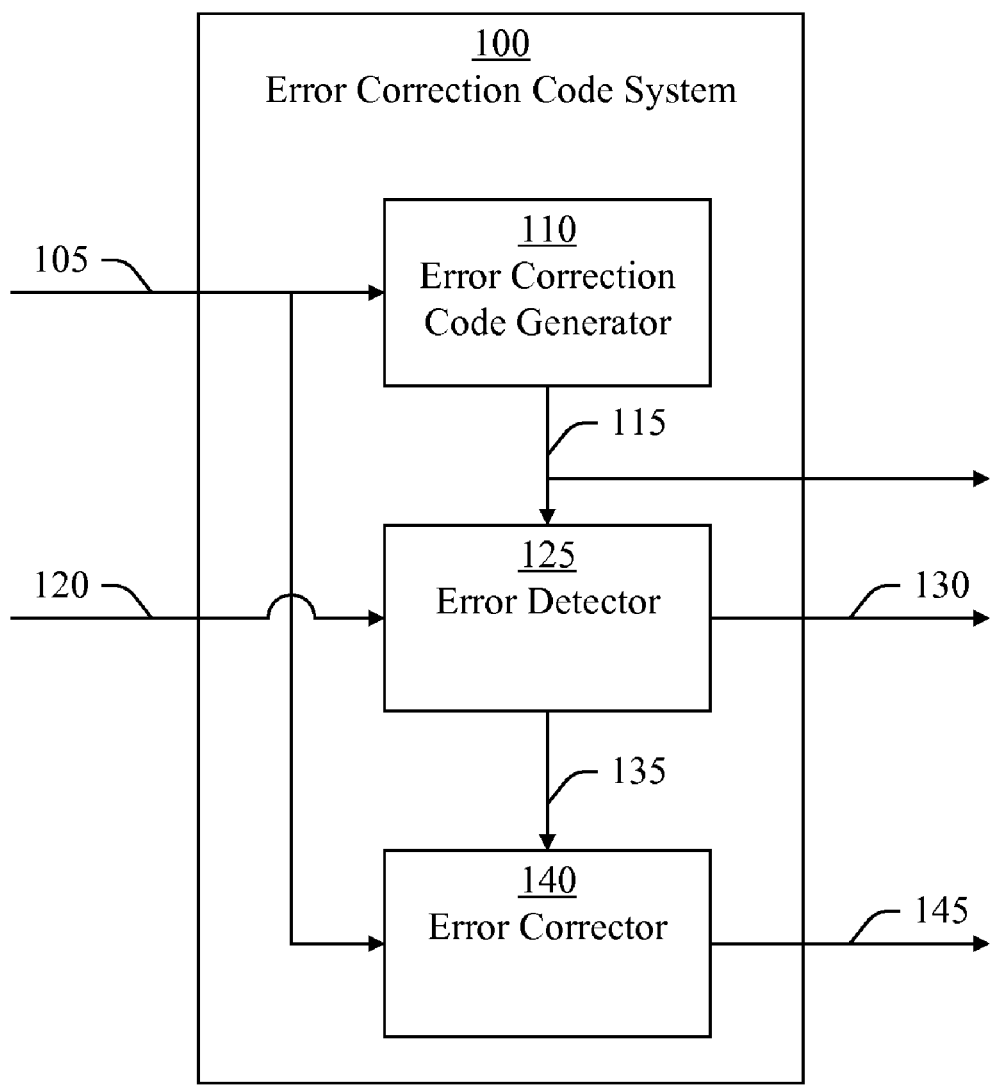
FIG. 1 is a block diagram of an error correction code system, in accordance with an embodiment of the present invention.

FIG. 1 illustrates an error correction code system 100, in accordance with an embodiment of the present invention. The error correction code system 100 includes an error correction code generator 110, an error detector 125, and an error corrector 140. The error detector 125 is coupled to the error correction code generator 110 and the error corrector 140. In various embodiments, the error correction code system 100 receives an input data unit 105 and an input error correction code 120 and determines whether the input data unit 105 has a bit error based on the input error correction code 120. The input data unit 105 may be any unit of data, such as a data byte, a data word, a data message, or the like. If the input data unit 105 has a bit error, the error correction code system 100 generates an output data unit 145 by correcting the bit error in the input data unit 105 and outputs the output data unit 145. Otherwise, if the input data unit 105 does not have a bit error, the error correction code system 100 generates the output data unit 145 by outputting the input data unit 105 as the output data unit 145. In this way, the error correction code system 100 generates the output data unit 145 based on the input data unit 105 and the input error correction code 120.

Additionally, the error correction code system 100 generates a status indicator 130 indicating whether the input data unit 105 has a bit error. In various embodiments, the error correction code system 100 may detect more than one bit error in the input data unit 105. In these embodiments, the error correction code system 100 generates the status indicator 130 indicating the number of bit errors in the input data unit 105. For example, the status indicator 130 may indicate whether the input data unit 105 has a single bit error or a double bit error. Further, the error correction code system 100 corrects one or more of the bit errors in the input data unit 105. In some embodiments, the error correction code system 100 detects up to a predetermined number of bit errors in the input data unit 105 and corrects up to a predetermined number of bits errors in the input data unit 105, which may be less than the number of bit errors detected in the input data unit 105.

In one embodiment, the error correction code system 100 detects both single bit errors and double bit errors in the input data unit 105 and corrects single bit errors in the input data unit 105. If the error correction code system 100 detects a single bit error in the input data unit 105, the error correction code system 100 generates the status indicator 130 indicating a single bit error in the input data unit 105 and corrects the single bit error in the input data unit 105. Otherwise, if the error correction code system 100 detects a double bit error in the input data unit 105, the error correction code system 100 generates the status indicator 130 indicating a double bit error in the input data unit 105. In other embodiments, the error correction code system 100 may detect more than two bit errors in the input data unit 105 and may correct more than one bit error in the input data unit 105.

In some embodiments, the error correction code system 100 receives a first input data unit 105 and generates a determined error correction code 115 based on the first input data unit 105. The error correction code system 100 then receives a second input data unit 105 and an input error correction code 120. The second input data unit 105 represents the first input data unit 105 and the input error correction code 120 represents the determined error correction code 115, for example after transmission of the first input data unit 105 and the determined error correction code 115 through a medium. It is to be appreciated that the second input data unit 105 or the input error correction code 120, or both, may have one or more bit errors after transmission of the first input data unit 105 and the determined error correction code 115 through the medium. Further, the error correction code system 100 generates an output data unit 145 by detecting up to a predetermined number of bit errors in the second input data unit 105 and correcting up to a predetermined number of bit errors in the second input data unit 105.

In various embodiments, the error correction code generator 110 receives the input data unit 105, generates the determined error correction code 115 based on the input data unit 105, and provides the determined error correction code 115 to the error detector 125. The determined error correction code 115 includes a number of check bits for detecting bit errors in the input data unit 105, as is described more fully herein. In some embodiments, the error correction code system 100 also outputs the determined error correction code 115 generated by the error correction code generator 110.

The error detector 125 receives the input error correction code 120 and generates the status indicator 130 based on the determined error correction code 115 and the input error correction code 120. Additionally, the error detector 125 generates an error indicator 135 based on the determined error correction code 115 and the input error correction code 120 and provides the error indicator 135 to the error corrector 140. The error indicator 135 indicates which data bits, if any, have a bit error in the input data unit 105. In this way, the error indicator 135 identifies data bits in the input data unit 105 having a bit error.

The error corrector 140 receives the input data unit 105 and the error indicator 135. If the error indicator 135 indicates that one or more data bits in the input data unit 105 have a bit error, the error corrector 140 corrects each of those bit errors. For example, if the error indicator 135 indicates a single data bit in the input data unit 105 has a bit error, the error corrector 140 corrects the bit error in that data bit.

In various embodiments, the error correction code system 100 is incorporated into a communication system, such as a wireless communication system, or a memory device, such as a random access memory (RAM). In one embodiment, the error correction code system 100 is incorporated into a logical RAM implemented with multiple physical RAMs. In this embodiment, the error correction code system 100 may use bits of the logical RAM which would otherwise be unused. For example, a logical RAM may store a first input data unit 105 having seventy-three data bits. In this example, an error correction code for detecting double bit errors and correcting single bit errors requires a minimum of nine check bits. Thus, the logical RAM width requires a minimum width of eighty-two bits, which includes seventy-three data bits and nine check bits. If the physical RAMs in the logical RAM each have a width of 28 bits, the logical RAM has a width of eighty-four bits. Because the logical RAM only needs to store eighty-two bits, two bits of the logical RAM may be unused. Further in this example, the error correction code system 100 may generate a first determined error correction code 115 having eleven bits to take advantage of the two unused bits of the logical RAM. Thus, the logical RAM stores eighty-four bits of data, which includes seventy-three data bits of the first input data unit 105 and eleven check bits of the first determined error correction code 115. Moreover, the speed of the error correction code system 100 is increased by increasing the number of check bits in the first determined error correction code 115, as is described more fully herein. In operation, the eighty-four data bits are retrieved from the logical RAM as a second input data unit 105 and an input error correction code 120. The error code correction system 100 generates a second determined error correction code 115 based on the second input data unit 105 and detects and corrects bit errors in the second input data unit 105 by comparing the second determined error correction code 115 with the input error correction code 120.

Figure 2:
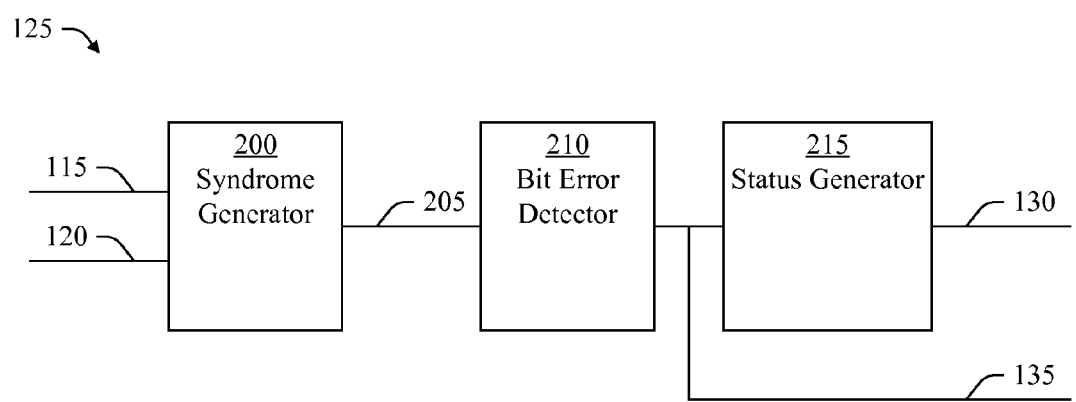
FIG. 2 is a block diagram of an error detector, in accordance with an embodiment of the present invention.

FIG. 2 illustrates the error detector 125, in accordance with an embodiment of the present invention. The error detector 125 includes a syndrome generator 200, a bit error detector 210, and a status generator 215. The bit error detector 210 is coupled to the syndrome generator 200 and the status generator 215. The syndrome generator 200 generates a syndrome 205 by comparing the determined error correction code 115 with the input error correction code 120. For example, the syndrome generator 200 may generate the syndrome 205 by performing an exclusive OR operation (e.g., a bit-wise exclusive OR operation) on the determined error correction code 115 and the input error correction code 120. The bit error detector 210 generates the error indictor 135 based on the syndrome 205. The status generator 215 generates the status indicator 130 based on the error indicator 135.

Figure 3:
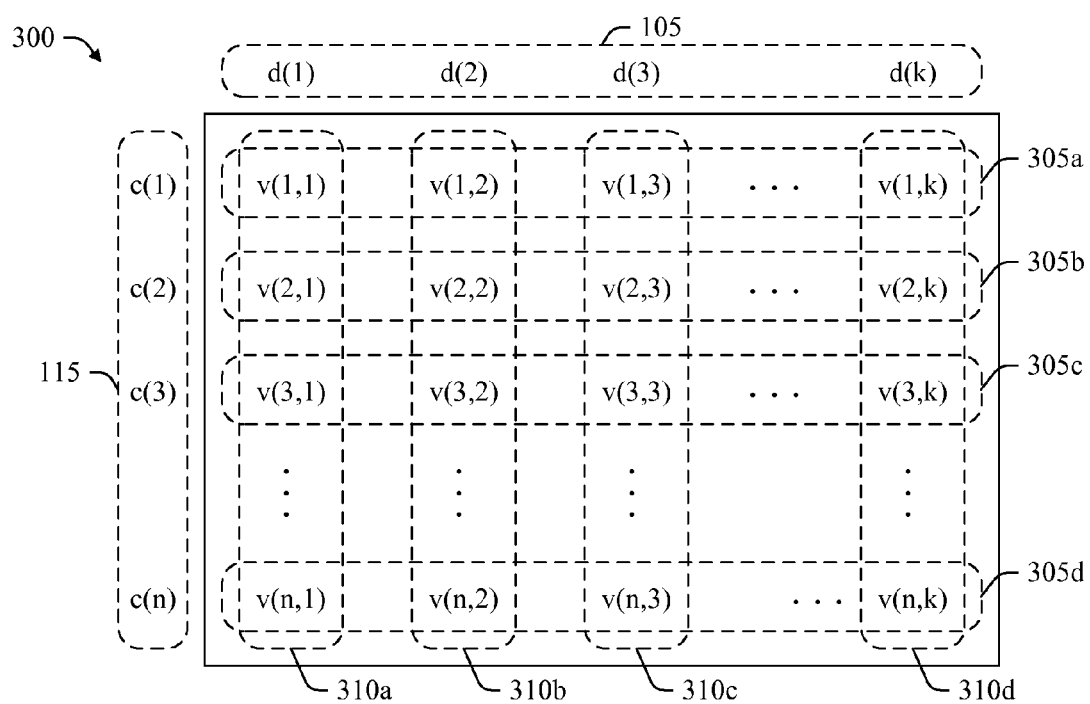
FIG. 3 is block diagram of a code matrix, in accordance with an embodiment of the present invention.

FIG. 3 illustrates a code matrix 300, in accordance with an embodiment of the present invention. The code matrix 300 is used to construct the error correction code system 100, as is further discussed herein. Each column of the code matrix 300 is associated with a data bit (e.g., data bits d(1)-d(k)) of the input data unit 105 and represents a unique group code 310 (e.g., group codes 310a-310d) that includes data values (e.g., data values v(1,1)-v(n,k)) in the column. As illustrated in FIG. 3, the data bits of the input data unit 105 are labeled d(1)-d(k) and the data values of the group codes 310 are labeled v(1,1)-v(n,k), where n represents a row number of the code matrix 300 and k represents a column number of the code matrix 300. Additionally, each row of the code matrix 300 is associated with a check bit (e.g., check bits c(1)-c(n)) of the determined error correction code 115 and represents a check code 305 (e.g., check codes 305a-d) that includes data values in the row. As illustrated in FIG. 3, the check bits of the determined error correction code 115 are labeled c(1)-c(n), where n represents a row number of the code matrix 300. As illustrated in FIG. 3, each of the check codes 305 includes a data value in each of the group codes 310. Moreover, the input data unit 105 includes k data bits and the determined error correction code 115 includes n check bits.

Additionally, each of the group codes 310 in the code matrix 300 represents a vector containing the data values of the column representing the group code 310. Moreover, the vectors are separated from each other by at least a minimum hamming distance needed for detecting and correcting a number of bit errors in the input data unit 105. In this way, the group codes 310 are separated from each other by the minimum hamming distance. As illustrated in FIG. 3, the group code 310a includes the data values v(1,1), v(2,1), and v(3,1) through v(n,1). The group code 310b includes the data values v(1,2), v(2,2), and v(3,2) through v(n,2). The group code 310c includes the data values v(1,3), v(2,3), and v(3,3) through v(n,3). The group code 310d includes the data values v(1,k), v(2,k), and v(3,k) through v(n,k). As also illustrated in FIG. 3, the check code 305a includes the data values v(1,1), v(1,2), and v(1,3) through v(1,k). The check code 305b includes the data values v(2,1), v(2,2), and v(2,3) through v(2,k). The check code 305c includes the data values v(3,1), v(3,2), and v(3,3) through v(3,k). The check code 305d includes the data values v(n,1), v(n,2), and v(n,3) through v(n,k).

The number of bit errors to be detected and corrected by the error correction code system 100 is determined during construction of the error correction code system 100 and the minimum hamming distance is determined based on the number of bit errors to be detected and corrected. In some embodiments, a number of bit errors to be detected by the error correction code system 100 is greater than a number of bits errors to be corrected by the error correction code system 100. For example, the error correction code system 100 may be constructed to detect double bits errors in the input data unit 105 and correct single bit errors in the input data unit 105. In these embodiments, a minimum hamming distance is determined such that the error correction code system 100 detects double bit errors and corrects single bit errors. In some embodiments, a hamming distance greater than the minimum hamming distance is selected for construction of the error correction code system 100.

In general, the minimum hamming distance among the group codes 310 for correcting r errors and detecting q errors in the input data unit 105 is expressed by the following equation, where t is the minimum hamming distance and q is greater than r.

$$t = q + r - 1$$

For example, a minimum hamming distance among the group codes 310 for detecting and correcting a single bit error and detecting a double bit error in the input data unit 105 is two. The minimum hamming distance among the group codes 310 is less than a theoretical minimum hamming distance for detecting and correcting a single bit error and detecting a double bit error using known methods involving an H matrix in combination with an identity matrix. Generally, the minimum hamming distance among the group codes 310 may be determined by subtracting two from the theoretical minimum hamming distance determined by known methods involving an H matrix in combination with an identity matrix because the identity matrix accounts for a hamming distance of two.

The number of check bits in the code matrix 300 is determined based on the number of data bits in the input data unit 105 and may depend upon the population count of each of the group codes 310, as is described more fully herein. In some embodiments, a minimum number of check bits for detecting and correcting bit errors in the input data unit 105 is determined during construction of the error correction code system 100. For single error detection and correction, the minimum number of check bits needed for the determined error correction code 115 generally depends on a number of data bits in the input data unit 105 and may be expressed by the following equation, where n is the minimum number of check bits and k is the number of data bits.

$$n+k+1<2^n$$

For example, if the input data unit 105 includes five data bits, the minimum number of check bits needed for detecting and correcting a single bit error is four. Because the check bits correspond to data values in each of the group codes 310, the number of check bits selected for the error correction code system 100 determines the number of data values in each of the group codes 310. Stated differently, the number of check bits in the determined error correction code 115 is the same as the number of data values in each of the group codes 310. Generally, an additional check bit is needed for detecting an additional bit error in the input data unit 105. For example, five check bits are needed for detecting and correcting a single bit error and detecting a double bit error in the input data unit 105. Moreover, an additional check bit is needed for correcting an additional detected bit error. For example, six check bits are needed for detecting and correcting a single bit error or a double bit error in the input data unit 105.

In various embodiments, the group codes 310 each have the same population count. The population count of a group code 310 indicates the number of data values having a same logic state in the group code 310. For example, the logic state may be a logic value of one. Because the group codes 310 each have the same population count, propagation delays of logic circuits in the error detector 125 are reduced, as is described more fully herein. Moreover, the propagation delays for generating the status indicator 130, the error indicator 135, and the output data unit 145 are decreased. In this way, the speed of the error correction code system 100 is increased. In other embodiments, variance among the population counts of the group codes 310 in minimized, which simplifies logic circuits in the error detector 125 and reduces propagation delays of the logic circuits.

The group codes 310 of the code matrix 300 are determined by generating a pool of group codes 310 separated from each other by a selected hamming distance. A population count is selected and group codes 310 having the selected population count are selected for the code matrix 300 from the pool of group codes 310. In one embodiment, if the pool of group codes 310 does not contain a sufficient number of group codes 310 having the selected population count, the population count or the number of check bits, or both, are incremented and another pool of group codes 310 is generated. If the pool of group codes 310 still does not contain a sufficient number of group codes 310 having the selected population count, the process is repeated until the pool of group codes 310 contains a sufficient number of group codes 310 having the selected population count. In another embodiment, if the pool of group codes 310 does not contain a sufficient number of group codes 310 having the selected population count, group codes 310 are selected from the pool of group codes 310 to minimize a variance among the population counts of the selected group codes 310.

In various embodiments, one or more of the above processes are performed over a selected range of population counts and over a selected range of numbers of check bits to select multiple sets of group codes 310 separated from each other by the selected hamming distance. One of the sets of group codes 310 is then selected based on one or more characteristics, such as variance among the population counts of the check codes 305 in the set of group codes 310, variance among the population counts of the group codes 310, or propagation delays of logic circuits generated based on the selected set of group codes 310, or some combination of these characteristics.

In further embodiments, the group codes 310 are selected from the pool of group codes 310 to minimize both the population counts of group codes 310 and the population counts of the check codes 305 in the group codes 310. For example, group codes 310 having a same population count may be selected from the pool of group codes 310 and one or more of the selected group codes 310 may be replaced with other group codes 310 from the pool of group codes 310 to minimize the population counts of the check codes 305. In one embodiment, the group codes 310 are selected from the pool of group codes 310 for replacement to minimize variance among the population counts of the check codes 305. In a further embodiment, the group codes 310 are selected from the pool of group codes 310 for replacement such that the check codes 305 have a same population count.

In various embodiments, logic equations are determined for corresponding check bits of the determined error correction code 115 and logic circuits are determined based on the logic equations. Further, a propagation delay (e.g., a maximum propagation delay) is determined for each of the logic circuits, for example by performing a computer simulation of the logic circuits, and the group codes 310 are selected from the pool of group codes 310 to minimize the propagation delays and variance among the propagation delays.

In one embodiment, the group codes 310 are selected to reduce loading on the inputs of the logic circuits for generating the check bits of the determined error correction code 115 and to reduce loading on inputs of the logic circuits for identifying data bits having a bit error in the input data unit 105. In this embodiment, group codes 310 are selected to minimize variance among the population counts of both the check codes 305 and the group codes 310. In a further embodiment, the group codes 310 are also selected to minimize propagation delays of the logic circuits and variance among the propagation delays for generating the check bits of the determined error correction code 115 or the logic circuits for identifying data bits having a bit error in the input data unit 105, or both.

Logic equations are determined for generating check bits of the determined error correction code 115 based on data values having a same logic state (e.g., a logic state of one) in the check codes 305. In one embodiment, the logic equation for a check bit corresponding to a check code 305 represents an exclusive OR operation on the data bits of input data unit 105 corresponding to data values having a logic state of one in the check code 305. In a further embodiment, logic circuits are determined for generating the check bits of the determined error correction code 115 based on the logic equations.

In this further embodiment, each of the logic circuits corresponds to one of the logic equations and generates the check bit of the determined error correction code 115 corresponding to the check bit.

In some embodiments, the logic circuits for generating the check bits are synthesized based on the logic equations. In one embodiment, the logic equations are expressed in a computing code by using a hardware description language (HDL), such as Verilog™ available from Cadence, Inc. of San Jose, Calif., and the logic circuits are synthesized based on the computing code by using a logic circuit synthesis tool. For example, the logic circuits may be synthesized from a standard cell library based on the computing code by using a logic circuit synthesis tool, such as Design Compiler™ available from Synopsys, Inc. of Mountain View, Calif. In further embodiments, the propagation delays of the logic circuits may be determined by performing computer simulations on the synthesized logic circuits.

In one embodiment, the processes of selecting the group codes 310, determining the logic equations for generating the check bits in the determined error correction code 115, synthesizing the logic circuits for generating the check bits of the determined error correction code 115, and simulating the logic circuits to determine propagation delays (e.g., maximum propagation delays) of the logic circuits are controlled by a computer program. Further, the computer program may perform these processes in an iterative manner to reduce the propagation delays in the logic circuits and minimize variance among the propagation delays.

In various embodiments, syndrome masks are generated based on the code matrix 300 for determining logic equations used in construction of the error detector 125. Each of these logic equations functions to identify a data bit having a bit error in the input data unit 105 based on the syndrome 205. Each syndrome mask corresponds to a data bit of the input data unit 105 and to the group code 310 that corresponds to that data bit. In embodiments in which the group codes 310 have a same population count, a syndrome mask is generated for a data bit of the input data unit 105 by replacing each data value having a same logic state (e.g., a logic state of zero) in the corresponding group code 310 with an indeterminate logic state (e.g., a don't care logic state). A logic equation for identifying the data bit in the input data unit 105 having a bit error is then determined based on the syndrome mask.

In one embodiment, the logic equation for identifying a data bit having a bit error in the input data unit 105 represents a comparison of the syndrome 205 with a syndrome mask associated with the data bit. The logic equation functions to generate a data value of one if the syndrome mask matches the syndrome 205 and to generate a data value of zero if the syndrome mask does not match the syndrome 205. In another embodiment, the logic equation represents an AND operation on those data bits of the syndrome 205 corresponding to the data values in syndrome mask having a same logic state that is determinate (e.g., a logic state of one). In this embodiment, the remaining data values in the syndrome mask have an indeterminate logic state (e.g., a don't care logic state). Moreover, the logic equation functions to generate a data value of one if the data bit of the input data unit 105 corresponding to the syndrome mask has a bit error and a data value of zero if the data bit of the input data unit 105 corresponding to the syndrome mask does not have a bit error. In a further embodiment, a corresponding logic circuit is determined for each of the logic equations and generates an output having the function of the corresponding logic equation.

In one embodiment, logic equations for the status indicator 130 are determined based on the logic equations for identifying the data bits having a bit error in the input data unit 105. In one embodiment, the status indicator 130 has a bit error indicator indicating whether any data bit in the input data unit 105 has a bit error. In this embodiment, the logic equation for generating the bit error indicator is based on the outputs of the logic equations for identifying the data bits having a bit error in the input data unit 105. The logic equation for generating the bit error indicator functions to generate a data value of one if any data bit in the input data unit 105 has a bit error and to generate a data value of zero if no data bit in the input data unit 105 has a bit error. In a further embodiment, a logic circuit is determined for the logic equation and generates an output indicating whether any data bit in the input data unit 105 has a bit error.

In some embodiments, the status indicator 130 includes a single bit error indicator and a double bit error indicator. In these embodiments, a logic equation is determined for identifying a single bit error in the input data unit 105 and a logic equation is determined for identifying a double bit error in the input data unit 105. The logic equation for identifying a single bit error in the input data unit 105 represents a logic operation to be performed on the outputs of the logic equations for identifying the data bits having a bit error in the input data unit 105. In one embodiment, the logic equation for identifying a single bit error in the input data unit 105 functions to generate a data value of one if the input data unit 105 has an odd number of bit errors and functions to generate a data value of zero if the input data unit 105 does not have any bit errors or the input data unit 105 has an even number of bit errors. Thus, the logic equation may be used identify single bit errors if the number of bit errors in the input data unit 105 does not exceed two. In a further embodiment, a logic circuit is determined for generating the single bit error indicator based on the logic equation for identifying the single bit error in the input data unit 105.

The logic equation for identifying a double bit error in the input data unit 105 represents a logic operation to be performed on the outputs of the logic equations for identifying the data bits having a bit error in the input data unit 105. In one embodiment, the logic equation for identifying a double a bit error in the input data unit 105 functions to generate a data value of one if the input data unit 105 has an even number of bit errors and functions to generate a data value of zero if the input data unit 105 has an odd number of bit errors. Thus, the logic equation may be used to identify double bits errors if the number of bit errors in the input data unit 105 does not exceed three. In a further embodiment, a logic circuit is determined for generating the double bit error indicator based on the logic equation for identifying the double bit error in the input data unit 105.

Figure 4:
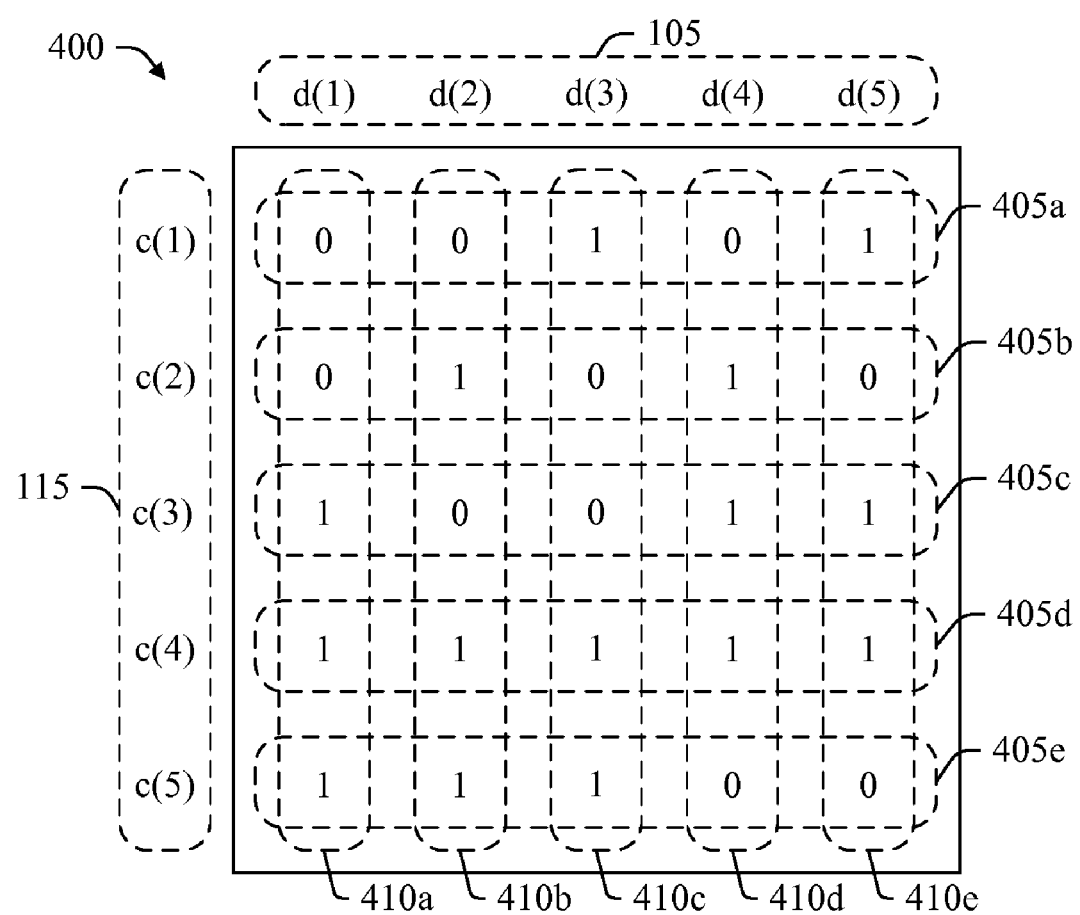
FIG. 4 is a block diagram of a code matrix, in accordance with an embodiment of the present invention.

FIG. 4 illustrates a code matrix 400, in accordance with an embodiment of the present invention. The code matrix 400 includes exemplary group codes 410 (e.g., group codes 410a-e) selected for construction of an error correction code system 100 in which the number of data bits in the input data unit 105 is five and the selected hamming distance is two. Because the selected hamming distance is two, the error correction code system 100 may be constructed to detect double bit errors and correct single bit errors in the input data unit 105. Although the minimum number of check bits of the determined error correction code 115 needed to detect double bit errors and correct single bit errors in the input data unit 105 is four, the selected number of check bits of the determined error correction code 115 in the exemplary code matrix 400 is five so that group codes 410 having a same population count may be selected for the code matrix 400.

As illustrated in FIG. 4, the group code 410a represents a vector having a value of 00111 and a population count of three. The group code 410b represents a vector having a value of 01011 and a population count of three. The group code 410c represents a vector having a value of 10011 and a population count of three. The group code 410d represents a vector having a value of 01110 and a population count of three. The group code 410e represents a vector having a value of 10110 and a population count of three. Because the group codes 410 have the same population count, logic equations for constructing the bit error detector 210 may be simplified (e.g., optimized) and the bit error detector 210 may be constructed based on the logic equations to reduce propagation delays in the bit error detector 210, as is described more fully herein.

In the exemplary code matrix 400 of FIG. 4, each of the group codes 410 has a population count of three. Further, the group codes 410 includes check codes 405 having population counts ranging from two to five. As illustrated in FIG. 4, the check code 405a represents a vector having a value of 00101 and a population count of two. The check code 405b represents a vector having a value of 01010 and a population count of two. The check code 405c represents a vector having a value of 10011 and a population count of three. The check code 405d represents a vector having a value of 11111 and a population count of five. The check code 405e represents a vector having a value of 11100 and a population count of three.

Figure 5:
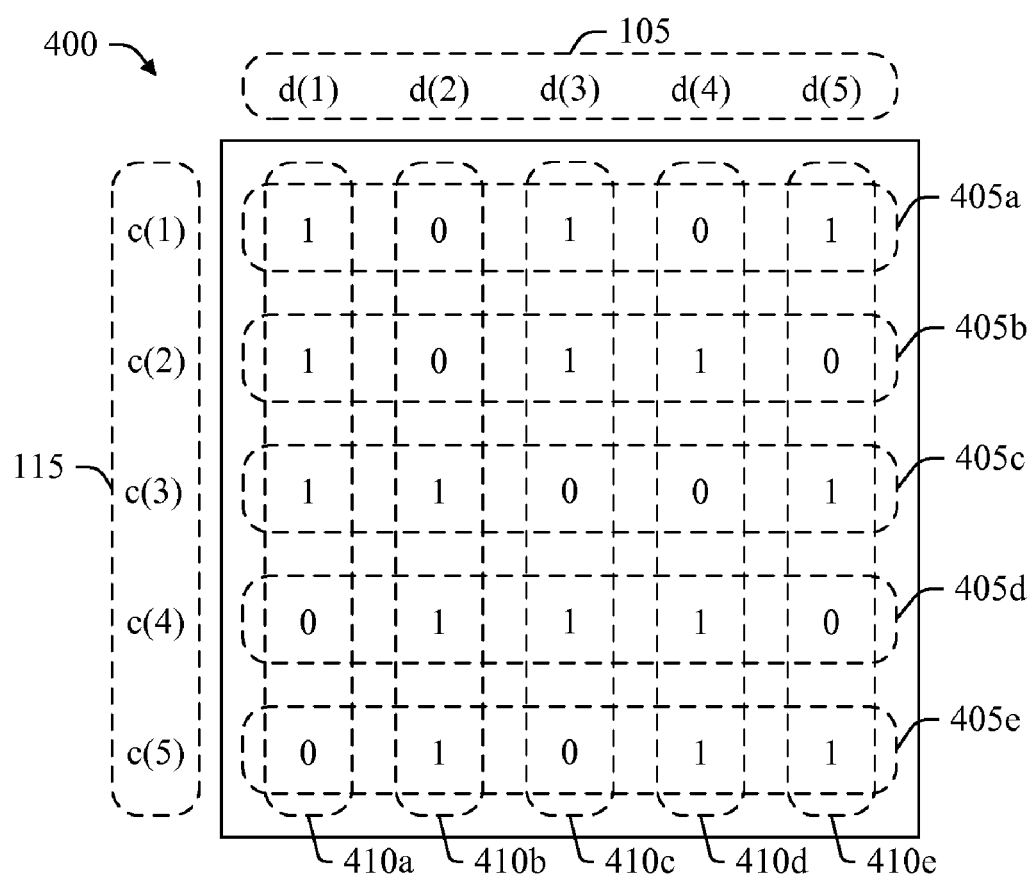
FIG. 5 is a block diagram of a code matrix, in accordance with an embodiment of the present invention.

FIG. 5 illustrates the code matrix 400, in accordance with an embodiment of the present invention. The code matrix 400 includes exemplary group codes 410 (e.g., group codes 410a-e) selected for construction of an error correction code system 100 in which the number of data bits in the input data unit 105 is five and the selected hamming distance is two. As illustrated in FIG. 5, the group code 410a represents a vector having a value of 11100 and a population count of three. The group code 410b represents a vector having a value of 00111 and a population count of three. The group code 410c represents a vector having a value of 11010 and a population count of three. The group code 410d represents a vector having a value of 01011 and a population count of three. The group code 410e represents a vector having a value of 10101 and a population count of three. In the exemplary code matrix 400 of FIG. 5, each of the group codes 410 has a population count of three. Moreover, the group codes 410 are selected to minimize the population counts of the group codes 410. Because the group codes 410 have the same population count which is minimized, logic equations for constructing the bit error detector 210 may be simplified (e.g., optimized) and the bit error detector 210 may be constructed based on the logic equations to reduce propagation delays in the bit error detector 210, as is described more fully herein.

In contrast to the code matrix 400 of FIG. 4, the check codes 405 of the code matrix 400 of FIG. 5 each have a same population count. For example, the group codes 410 in the code matrix 400 of FIG. 5 may be selected by replacing the group codes 410 in the code matrix 400 of FIG. 4 with group codes 410 selected from a pool of group codes 410 so that the check codes 405 have the same population count. As illustrated in FIG. 5, the check code 405a represents a vector having a value of 10101 and a population count of three. The check code 405b represents a vector having a value of 10110 and a population count of three. The check code 405c represents a vector having a value of 11001 and a population count of three. The check code 405d represents a vector having a value of 01110 and a population count of three. The check code 405e represents a vector having a value of 01011 and a population count of three. Moreover, the group codes 410 are selected to minimize the population counts of the check codes 405. Because the check codes 405 have the same population count which is minimized, logic equations for constructing the error correction code generator 110 may be simplified (e.g., optimized) and the error correction code generator 110 may be constructed based on the logic equations to reduce propagation delays in error correction code generator 110, as is described more fully herein.

Figure 6:
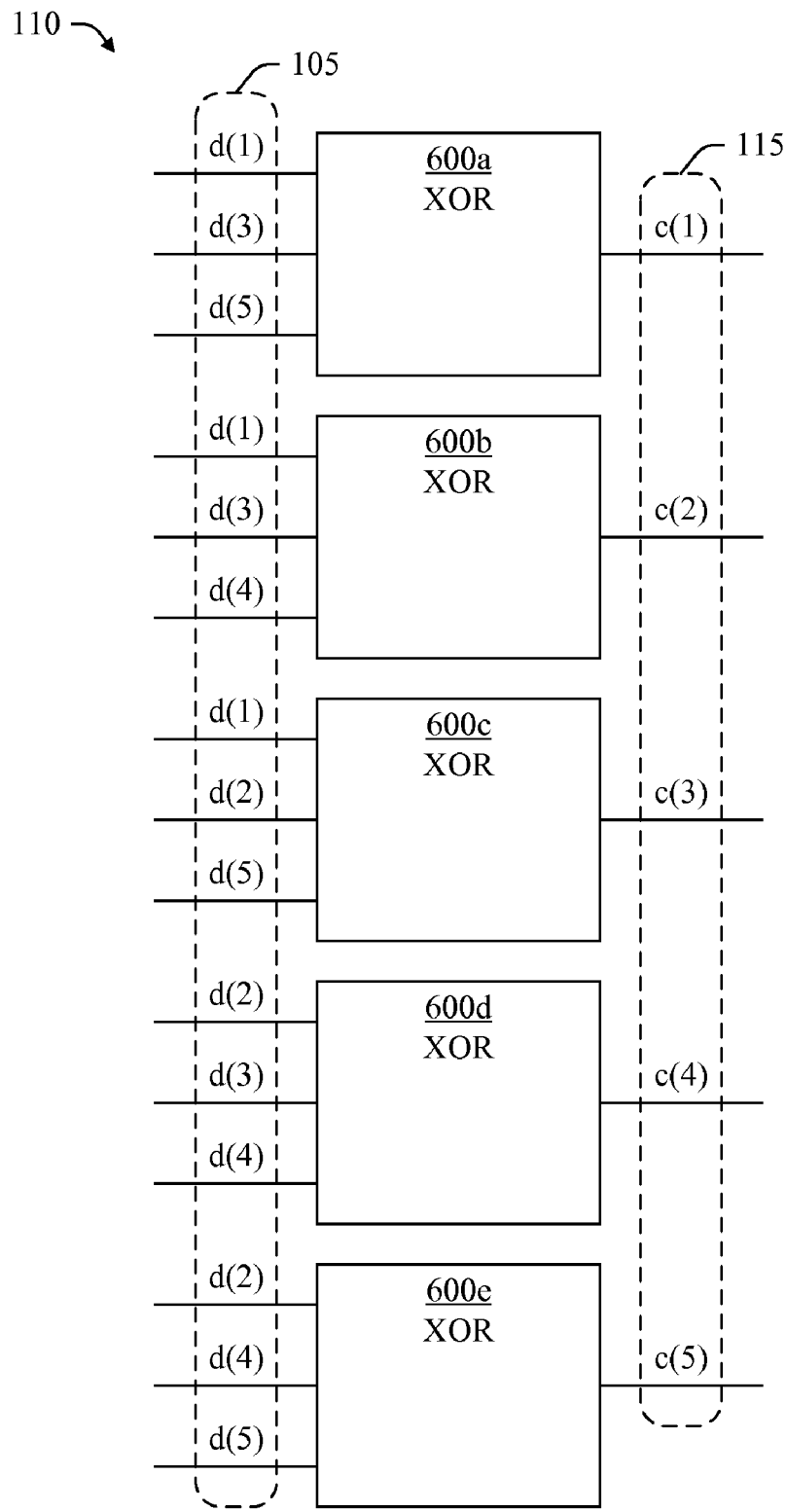
FIG. 6 is a block diagram of an error correction code generator, in accordance with an embodiment of the present invention.

FIG. 6 illustrates the error correction code generator 110, in accordance with an embodiment of the present invention. The error correction code generator 110 includes exemplary logic circuits determined based on the check codes 405 of the code matrix 400 of FIG. 5. The logic circuits of the error correction code generator 110 include exclusive OR circuits 600 (e.g., exclusive OR circuits 600a-e), each of which corresponds to a check code 405 and generates a check bit of the determined error correction code 115 corresponding to the check code 405. Moreover, the inputs to each of the exclusive OR circuits 600 are data bits of the input data unit 105 corresponding to data values having a value of one in the corresponding check code 405. Thus, each of the exclusive OR circuits 600 has a number of inputs equal to the population count of the check code 405 corresponding to the exclusive OR circuit 600. Because each of the exclusive OR circuits 600 has a same number of inputs, variation among propagation delays in the logic circuits of the error correction code generator 110 is reduced. Moreover, because the number of inputs of each of the exclusive OR circuits 600 is minimized, the maximum propagation delay in the logic circuits of the error correction code generator 110 is reduced. The logic equations of logic circuits in the error correction code generator 110 may be expressed as c(n)=XOR(d(x), d(y), d(z)), where n represents an index of a check bit c in the determined error correction code 115 and x, y, and z each represent an index of a data bit in the input data unit 105 corresponding to a data value having a same logic state (e.g., a logic state of one) in the check code 405 corresponding to the logic equation.

As illustrated in FIG. 6, the exclusive OR circuit 600a generates the check bit c(1) of the determined error correction code 115 by performing an exclusive OR operation on the data bits d(1), d(3), and d(5) of the input data unit 105. The logic equation of the exclusive OR circuit 600a may be expressed as c(1)=d(1) XOR d(3) XOR d(5). The exclusive OR circuit 600b generates the check bit c(2) of the determined error correction code 115 by performing an exclusive OR operation on the data bits d(1), d(3), and d(4) of the input data unit 105. The logic equation of the exclusive OR circuit 600b may be expressed as c(2)=d(1) XOR d(3) XOR d(4). The exclusive OR circuit 600c generates the check bit c(3) of the determined error correction code 115 by performing an exclusive OR operation on the data bits d(1), d(2), and d(5) of the input data unit 105. The logic equation of the exclusive OR circuit 600c may be expressed as c(3)=d(1) XOR d(2) XOR d(5). The exclusive OR circuit 600d generates the check bit c(4) of the determined error correction code 115 by performing an exclusive OR operation on the data bits d(2), d(3), and d(4) of the input data unit 105. The logic equation of the exclusive OR circuit 600d may be expressed as c(4)=d(2) XOR d(3) XOR d(4). The exclusive OR circuit 600e generates the check bit c(5) of the determined error correction code 115 by performing an exclusive OR operation on the data bits d(2), d(4), and d(5) of the input data unit 105. The logic equation of the exclusive OR circuit 600d may be expressed as c(5)=d(2) XOR d(4) XOR d(5).

Figure 7:
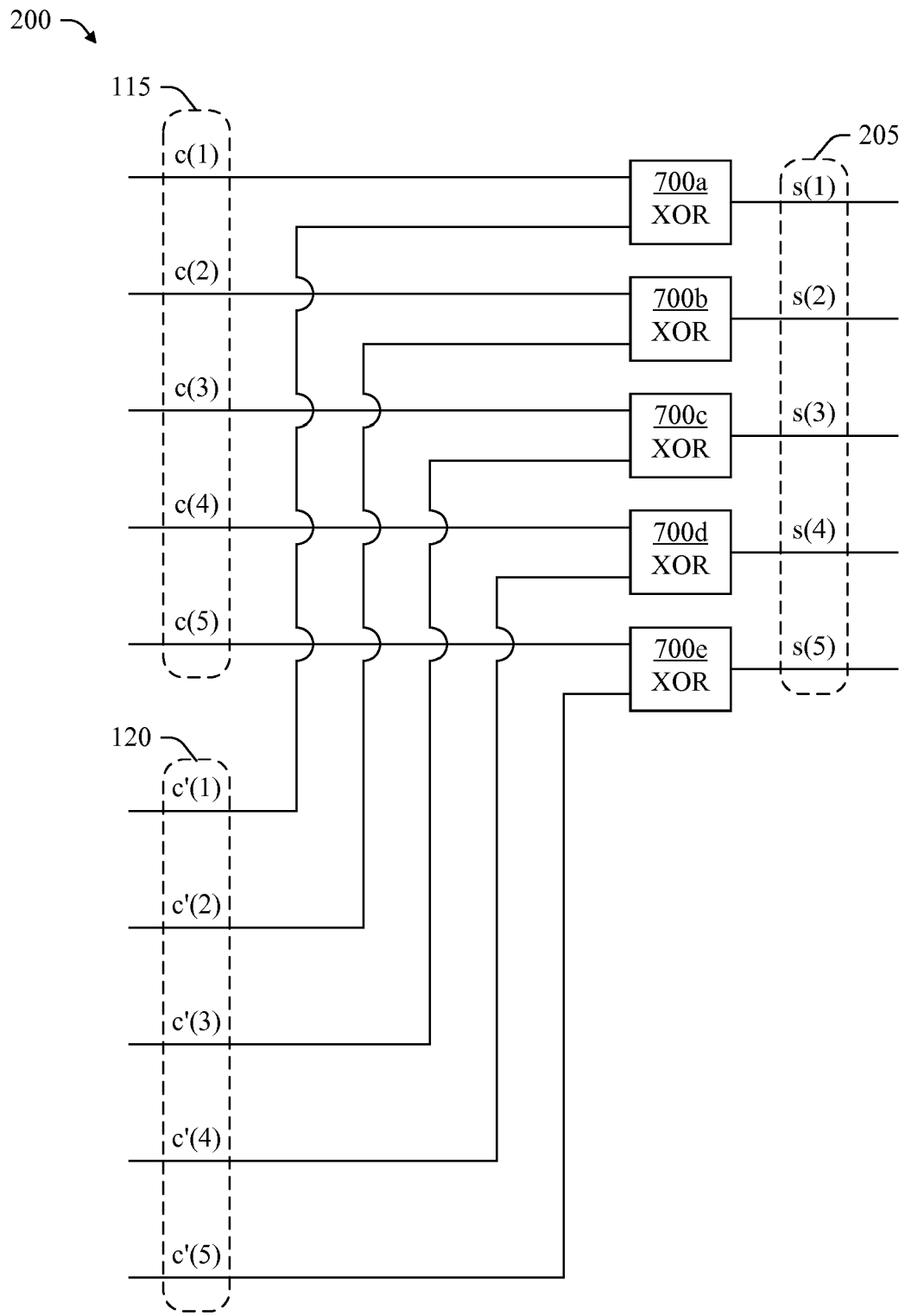
FIG. 7 is a block diagram of a syndrome generator, in accordance with an embodiment of the present invention.

FIG. 7 illustrates the syndrome generator 200, in accordance with an embodiment of the present invention. The syndrome generator 200 includes exemplary logic circuits determined based on the determined error correction code 115 (e.g., check bits c(1)-c(5)) and the input error correction code 120 (e.g., check bits c'(1)-c'(5)). The logic circuits of the syndrome generator 200 include exclusive OR circuits 700 (e.g., exclusive OR circuits 700(a-e)), each of which generates a syndrome bit s (e.g., syndrome bits s(1)-s(5)) of the syndrome 205 by performing an exclusive OR operation on a corresponding check bit c (e.g., check bits c(1)-c(5)) of the determined error correction code 115 and a corresponding check bit c' (e.g., c'(1)-c'(5)) of the input error correction code 120. In this way, the syndrome generator 200 generates the syndrome 205 by comparing the determined error correction code 115 with the input error correction code 120. The logic equations of the logic circuits in the syndrome generator 200 may be expressed as $s(n)=XOR(c(n), c'(n))$, where n represents an index of a check bit c in the determined error correction code 115, an index of a corresponding check bit c' in the input error correction code 120, and an index of a corresponding syndrome bit s in the syndrome 205.

As illustrated in FIG. 7, the exclusive OR circuit 700a generates the syndrome bit s(1) of the syndrome 205 by performing an exclusive OR operation on the check bit c(1) of the determined error correction code 115 and the check bit error c'(1) of the input error correction code 120. The logic equation of the exclusive OR circuit 700a may be expressed as $s(1)=c(1)$ XOR $c'(1)$. The exclusive OR circuit 700b generates the syndrome bit s(2) of the syndrome 205 by performing an exclusive OR operation on the check bit c(2) of the determined error correction code 115 and the check bit error c'(2) of the input error correction code 120. The logic equation of the exclusive OR circuit 700b may be expressed as $s(2)=c(2)$ XOR $c'(2)$. The exclusive OR circuit 700c generates the syndrome bit s(3) of the syndrome 205 by performing an exclusive OR operation on the check bit c(3) of the determined error correction code 115 and the check bit error c'(3) of the input error correction code 120. The logic equation of the exclusive OR circuit 700c may be expressed as $s(3)=c(3)$ XOR $c'(3)$. The exclusive OR circuit 700d generates the syndrome bit s(4) of the syndrome 205 by performing an exclusive OR operation on the check bit c(4) of the determined error correction code 115 and the check bit error c'(4) of the input error correction code 120. The logic equation of the exclusive OR circuit 700d may be expressed as $s(4)=c(4)$ XOR $c'(4)$. The exclusive OR circuit 700e generates the syndrome bit s(5) of the syndrome 205 by performing an exclusive OR operation on the check bit c(5) of the determined error correction code 115 and the check bit error c'(5) of the input error correction code 120. The logic equation of the exclusive OR circuit 700e may be expressed as $s(5)=c(5)$ XOR $c'(5)$.

Figure 8:
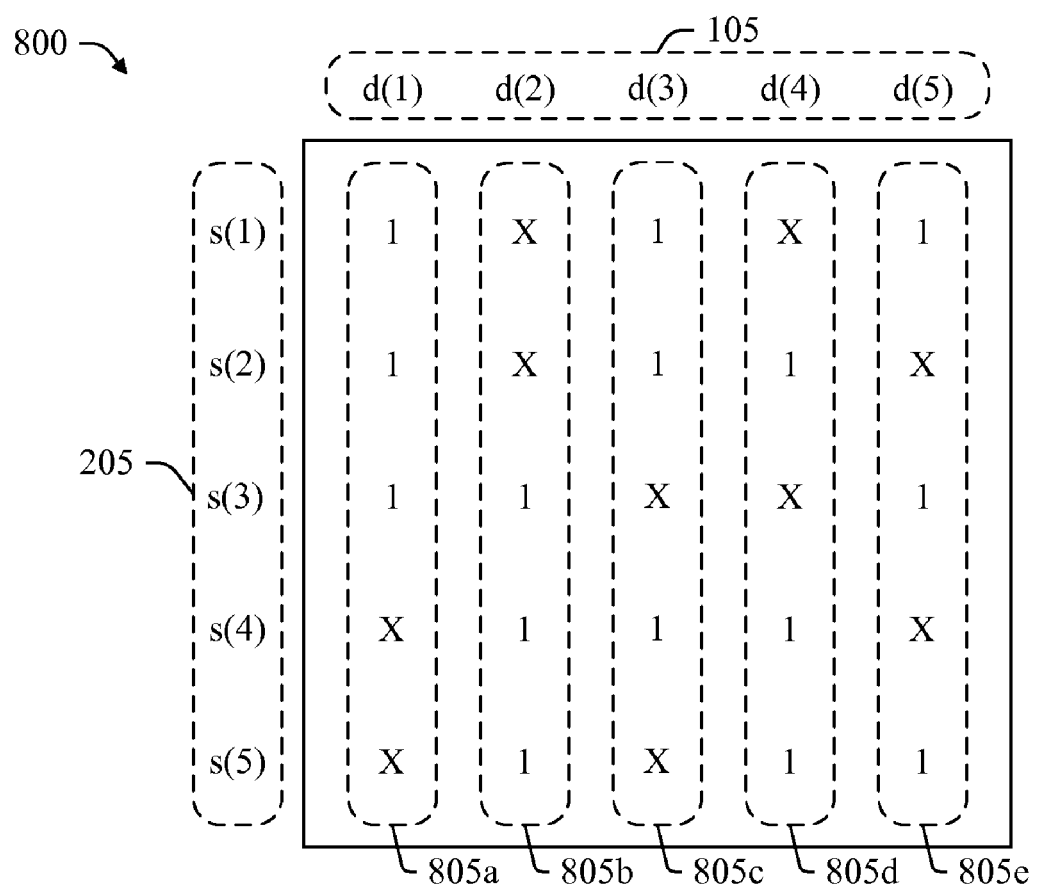
FIG. 8 is a block diagram of a syndrome mask matrix, in accordance with an embodiment of the present invention.

FIG. 8 illustrates a syndrome mask matrix 800, in accordance with an embodiment of the present invention. The syndrome mask matrix 800 may be used for determining logic equations for logic circuits in the bit error detector 210 when the group codes (e.g. group codes 410) in a code matrix (e.g., code matrix 400) have a same population count. The syndrome mask matrix 800 includes exemplary syndrome masks 805 (e.g., syndrome masks 805a-d) determined based on the group codes 410 of the code matrix 400 of FIG. 5. Each of the syndrome masks 805 in the syndrome mask matrix 800 corresponds to a group code 410 in the code matrix 400 and is generated by replacing the data values having a logic state of zero in the group code 410 with an indeterminate logic state (e.g., a don't care logic state X). As illustrated in FIG. 8, the syndrome mask 805a represents a vector having a value of 111XX and a population count of three. The syndrome mask 805b represents a vector having a value of XX111 and a population count of three. The syndrome mask 805c represents a vector having a value of 11X1X and a population count of three. The syndrome mask 805d represents a vector having a value of X1X11 and a population count of three. The syndrome mask 805e represents a vector having a value of 1X1X1 and a population count of three. In this embodiment, logic equations of the logic circuits in the bit error detector 210 are determined based on the data values having a logic state of one in the syndrome masks 805. Because the population count of each syndrome mask 805 is less than the number of check bits in the determined error correction code 115 or the input error correction code 120, logic equations for constructing the error correction code generator 110 may be simplified (e.g., optimized) by using the syndrome masks 805. Moreover, the error correction code generator 110 may be constructed based on the logic equations to reduce propagation delays in the error correction code generator 110, as is described more fully herein.

Figure 9:
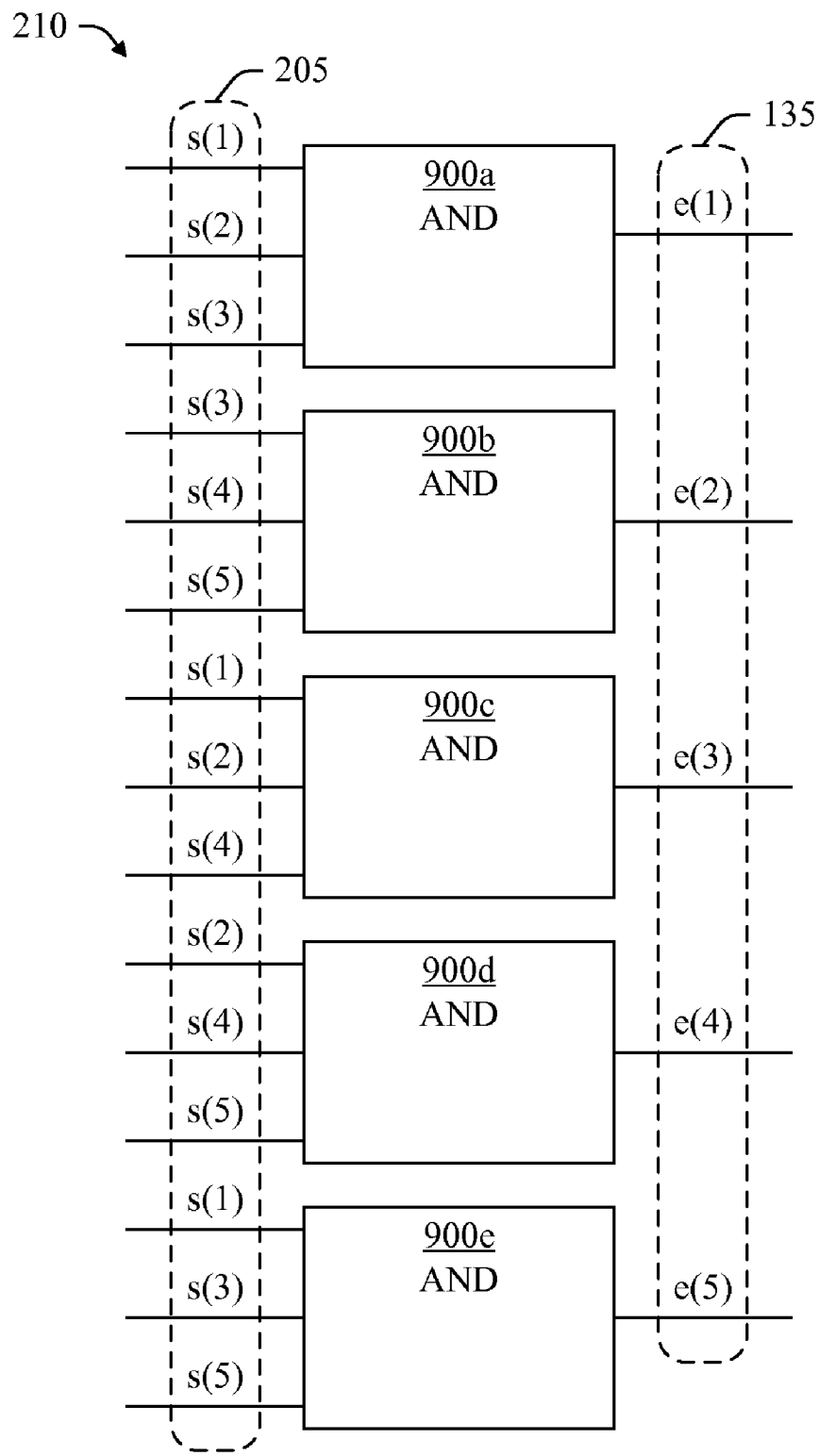
FIG. 9 is a block diagram of a bit error detector, in accordance with an embodiment of the present invention.

FIG. 9 illustrates the bit error detector 210, in accordance with an embodiment of the present invention. The bit error detector 210 includes exemplary logic circuits determined based on the syndrome masks 805 of the syndrome mask matrix 800 and the syndrome 205. The logic circuits of the bit error detector 210 include AND circuits 900 (e.g., AND circuits 900a-e), each of which corresponds to a data bit of the input data unit 105 and the corresponding group code 410 and generates a data bit error indictor e (e.g., data bit error indicators e(1)-e(5)) of the error indicator 135. Moreover, the inputs to each of the AND circuits 900 are syndrome bits s (e.g., syndrome bits s(1)-s(5)) of the syndrome 205 corresponding to data values having a value of one in the corresponding syndrome mask 805. Thus, each of the AND circuits 900 has a number of inputs equal to the population count of the group code 410 corresponding to the AND circuit 900. Because each of the AND circuits 900 has a same number of inputs, variation among propagation delays in the logic circuits of the bit error detector 210 is reduced. Moreover, because the number of inputs of each of the AND circuits 900 is minimized, the maximum propagation delay in the logic circuits (e.g., AND gates 900) of the bit error detector 210 is reduced. Logic equations for the logic circuits of the bit error detector 210 may be expressed as $e(n)=AND(s(x), s(y), s(z))$, where n represents an index of a bit error indicator e in the error indicator 135 and x, y, and z each represent an index of a syndrome bit in the syndrome 205 corresponding to a data value having a same logic state (e.g., a logic state of one) in the syndrome mask 805 corresponding to the logic equation.

As illustrated in FIG. 9, the AND circuit 900a generates the data bit error indicator e(1) of the error indicator 135 by performing an AND operation on the syndrome bits s(1), s(2), and s(3) of the syndrome 205. The logic equation of the AND circuit 900a may be expressed as $e(1)=s(1)$ AND $s(2)$ AND $s(3)$. The AND circuit 900b generates the data bit error indicator e(2) of the error indicator 135 by performing an AND operation on the syndrome bits s(3), s(4), and s(5) of the syndrome 205. The logic equation of the AND circuit 900b may be expressed as $e(2)=s(3)$ AND $s(4)$ AND $s(5)$. The AND circuit 900c generates the data bit error indicator e(3) of the error indicator 135 by performing an AND operation on the syndrome bits s(1), s(2), and s(4) of the syndrome 205. The logic equation of the AND circuit 900c may be expressed as $e(3)=s(1)$ AND $s(2)$ AND $s(4)$. The AND circuit 900d generates the data bit error indicator e(4) of the error indicator 135 by performing an AND operation on the syndrome bits s(2), s(4), and s(5) of the syndrome 205. The logic equation of the AND circuit 900d may be expressed as e(4)=s(2) AND s(4) AND s(5). The AND circuit 900e generates the data bit error indicator e(5) of the error indicator 135 by performing an AND operation on the syndrome bits s(1), s(3), and s(5). The logic equation of the AND circuit 900e may be expressed as e(5)=s(1) AND s(3) AND s(5). In other embodiments, the bit error detector 210 may include other types of logic circuits for computing the data bit error indicators e(1)-e(5) of the error indicator 135. For example, the AND circuits 900 may be replaced by exclusive OR circuits in other embodiments.

Figure 10:
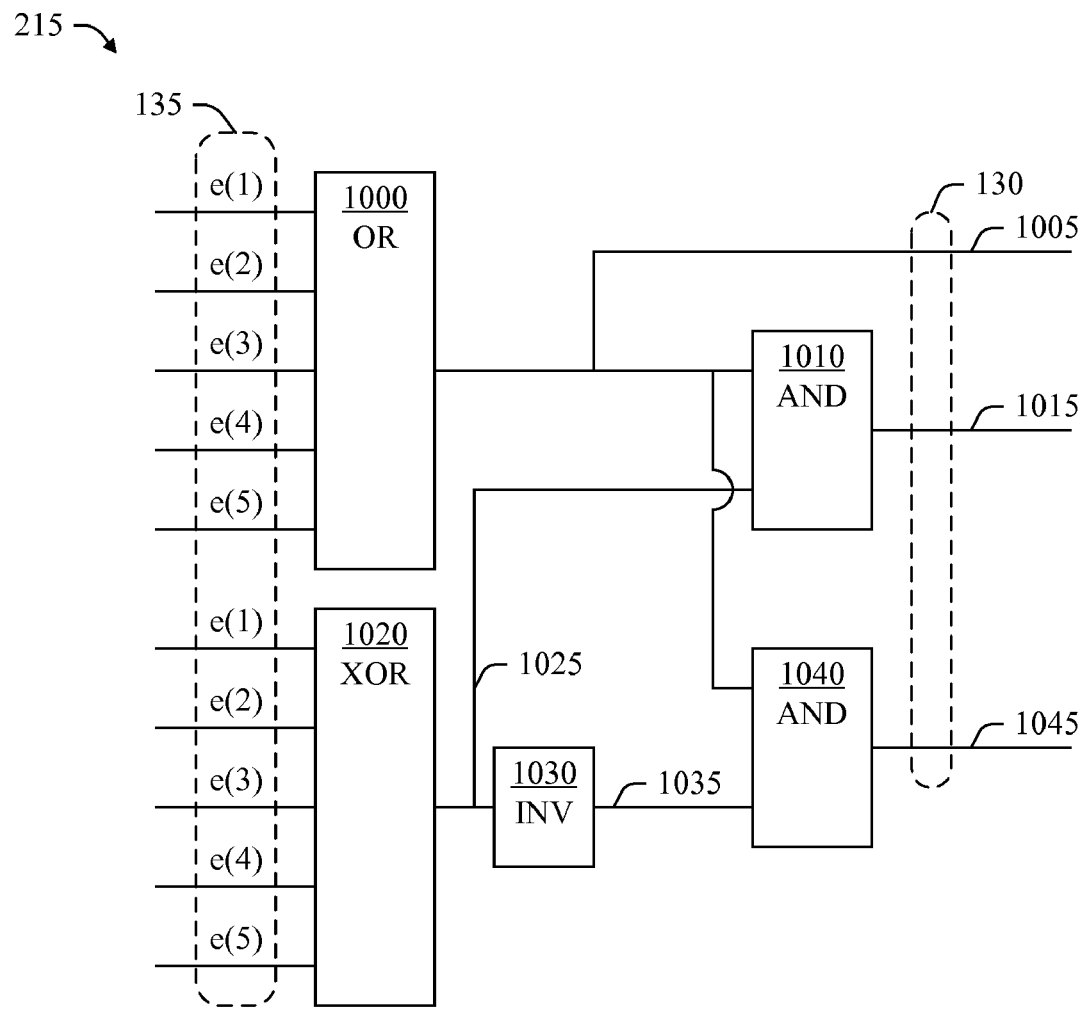
FIG. 10 is a block diagram of a status generator, in accordance with an embodiment of the present invention.

FIG. 10 illustrates the status generator 215, in accordance with an embodiment of the present invention. The status generator 215 includes exemplary logic circuits determined based on the data bit error indicators e (e.g., data error bit indicators e(1)-e(5)) generated by the bit error detector 210 of FIG. 9. The logic circuits of the status generator 215 include an OR circuit (OR) 1000, an AND circuit (AND) 1010, an exclusive OR circuit (XOR) 1020, an inverter (INV) 1030, and an AND circuit (AND) 1040. The OR circuit 1000 is coupled to the AND circuit 1010 and the AND circuit 1040. The exclusive OR circuit 1020 is coupled to the AND circuit 1010 and the inverter 1030. The inverter 1030 is coupled to the AND circuit 1040.

The logic equation of the logic circuit (e.g., the OR circuit 1000) for generating the bit error indicator 1005 may be expressed as berr=OR(e(1), e(2), . . . e(n)), where berr represents the bit error indicator 1005 and n represents the number of data bit error indicators e in the error indicator 135. The logic equation of the logic circuit (e.g., the OR circuit 1000, the AND circuit 1010, and the exclusive OR circuit 1020) for generating the single bit error indicator 1015 may be expressed as sberr=AND(OR(e(1), e(2), . . . e(n)), XOR(e(1), e(2), . . . e(n))), where sberr represents the single bit error indicator 1015 and n represents the number of data bit error indicators e in the error indicator 135. The logic equation of the logic circuit (e.g., the OR circuit 1000, the exclusive OR circuit 1020, the inverter 1030, and the AND circuit 1040) for generating the double bit error indicator 1045 may be expressed as dberr=AND(OR(e(1), e(2), . . . e(n)), INV(XOR (e(1), e(2), . . . e(n)))), where dberr represents the double bit error indicator 1045 and n represents the number of data bit error indicators e in the error indicator 135.

The OR circuit 1000 generates a bit error indicator 1005 by performing an OR operation on the data bit error indicators e (e.g., data bit error indicators e(1)-e(5)) in the error indicator 135. The bit error indicator 1005 indicates whether any data bit in the input data unit 105 has a bit error. The logic equation of the logic circuit for generating the bit error indicator 1005 may be expressed as berr=e(1) OR e(2) OR e(3) OR e(4) OR e(5), where berr represents the bit error indicator 1005. The exclusive OR circuit 1020 generates a parity indicator 1025 by performing an exclusive OR operation on the data bit error indicators e (e.g., data bit error indicators e(1)-e(5)) in the error indicator 135. The parity indicator 1025 indicates the parity of the error indicator 135 (e.g., an even parity or an odd parity). The AND circuit 1010 generates a single bit error indicator 1015 by performing an AND operation on the bit error indicator 1005 and the parity indicator 1025. The single bit error indicator 1015 indicates whether the input data unit 105 has a single bit error. The logic equation of the logic circuit for generating the single bit error indicator 1015 may be expressed as sberr=(e(1) OR e(2) OR e(3) OR e(4) OR e(5)) AND (e(1) XOR e(2) XOR e(3) XOR e(4) XOR e(5)), where sberr represents the single bit error indicator 1015. The inverter 1030 generates an inverted parity indicator 1035 by inverting the parity indicator 1025. The inverted parity indicator 1035 indicates a negated parity of the error indicator 135 (e.g., an odd parity or an even parity). The AND circuit 1040 generates a double bit error indicator 1045 by performing an AND operation on the bit error indicator 1005 and the inverted parity indicator 1035. The double bit error indicator 1045 indicates whether the input data unit 105 has a double bit error. The logic equation of the logic circuit for generating the double bit error indicator 1045 may be expressed as sberr=(e(1) OR e(2) OR e(3) OR e(4) OR e(5)) AND NOT (e(1) XOR e(2) XOR e(3) XOR e(4) XOR e(5)), where dberr represents the double bit error indicator 1045.

Figure 11:
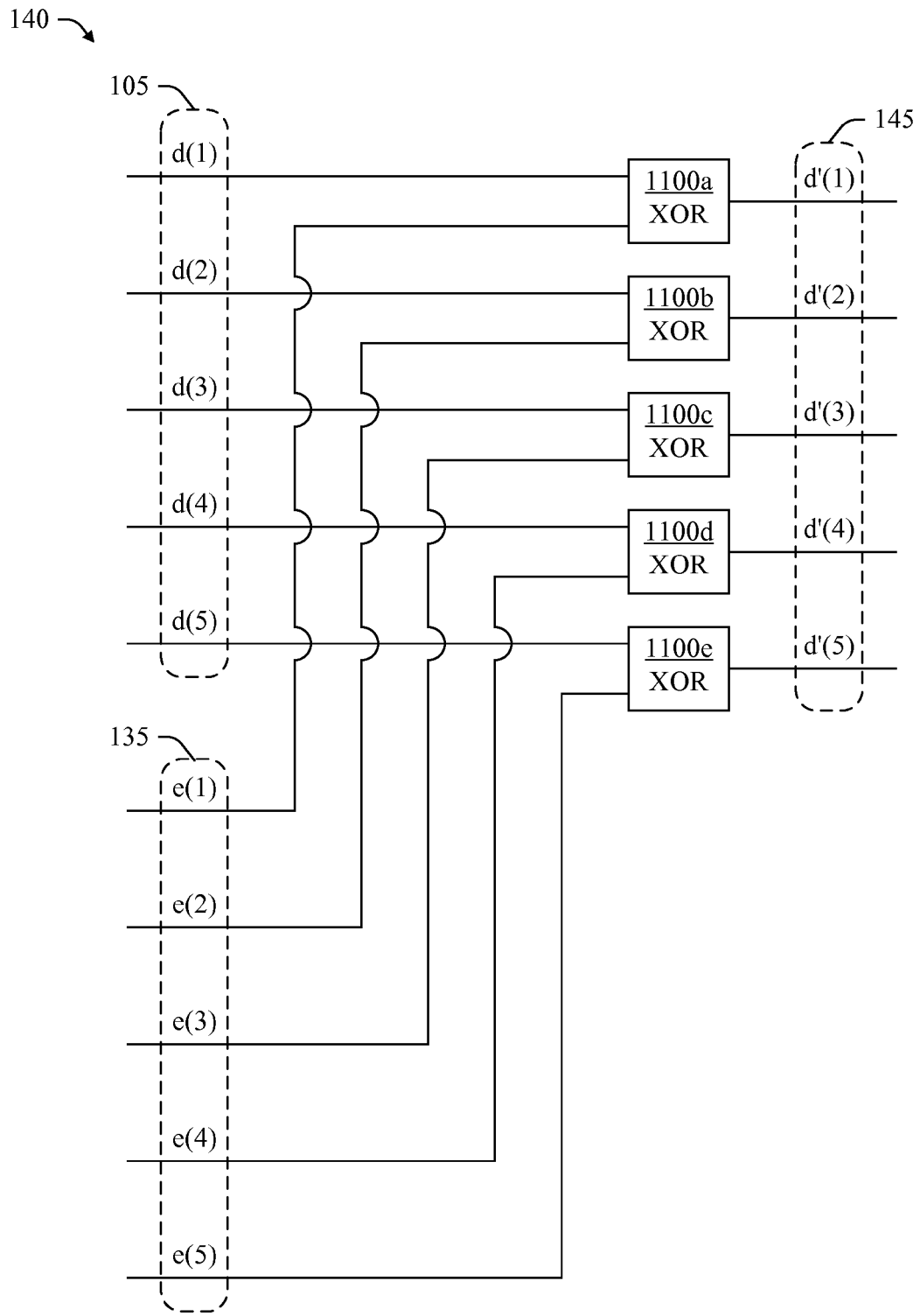
FIG. 11 is a block diagram of an error corrector, in accordance with an embodiment of the present invention.

FIG. 11 illustrates the error corrector 140, in accordance with an embodiment of the present invention. The error corrector 140 includes exemplary logic circuits determined based on the data bit error indicators e (e.g., data bit error indicators e(1)-e(5)) of the error indicator 135 generated by the bit error detector 210 of FIG. 9. The logic circuits of the error corrector 140 include exclusive OR circuits 1100 (e.g., exclusive OR circuits 1100(a-e)), each of which generates a data bit d' (e.g., data bits d'(1)-d'(5)) of the output data unit 145 by performing an exclusive OR operation on a corresponding data bit d (e.g., data bits d(1)-d(5)) of the input data unit 105 and a corresponding data bit error indicator e (e.g., e(1)-e(5)) of the error indicator 135. If the data bit error indicator input to the exclusive OR circuit 1100 has a value of zero, the exclusive OR circuit 1100 generates the data bit of the output data unit 145 by passing the data bit input to the exclusive OR circuit 1100. Otherwise, if the data bit error indicator input to the exclusive OR circuit 1100 has a value of one, the exclusive OR circuit 1100 generates the data bit of the output data unit 145 by inverting the data bit input to the exclusive OR circuit 1100. In this way, the error corrector 140 corrects a data bit of the input data unit 105 by inverting the data bit if the corresponding data bit error indicator indicates the data bit has a bit error. The logic equations of the logic circuits in the error correction 140 may be expressed as d'(n)= XOR(d(n), e(n)), where n represents an index of a data bit d in the input data unit 105, an index of a corresponding data bit error indicator e in the error indicator 135, and an index of a corresponding data bit d' in the output data unit 145.

As illustrated in FIG. 11, the exclusive OR circuit 1100a generates the data bit d'(1) of the output data unit 145 by performing an exclusive OR operation on the data bit d(1) of the input data unit 105 and the data bit error indicator e(1) of the error indicator 135. The logic equation of the exclusive OR circuit 1100a may be expressed as d'(1)=d(1) XOR e(1). The exclusive OR circuit 1100b generates the data bit d'(2) of the output data unit 145 by performing an exclusive OR operation on the data bit d(2) of the input data unit 105 and the data bit error indicator e(2) of the error indicator 135. The logic equation of the exclusive OR circuit 1100b may be expressed as d'(2)=d(2) XOR e(2). The exclusive OR circuit 1100c generates the data bit d'(3) of the output data unit 145 by performing an exclusive OR operation on the data bit d(3) of the input data unit 105 and the data bit error indicator e(3) of the error indicator 135. The logic equation of the exclusive OR circuit 1100c may be expressed as d'(3)=d(3) XOR e(3). The exclusive OR circuit 1100d generates the data bit d'(4) of the output data unit 145 by performing an exclusive OR operation on the data bit d(4) of the input data unit 105 and the data bit error indicator e(4) of the error indicator 135. The logic equation of the exclusive OR circuit 1100d may be expressed as d'(4)=d(4) XOR e(4). The exclusive OR circuit 1100e generates the data bit d'(5) of the output data unit 145 by performing an exclusive OR operation on the data bit d(5) of the input data unit 105 and the data bit error indicator e(5)

of the error indicator 135. The logic equation of the exclusive OR circuit 1100e may be expressed as d'(5)=d(5) XOR e(5).

Figure 12:
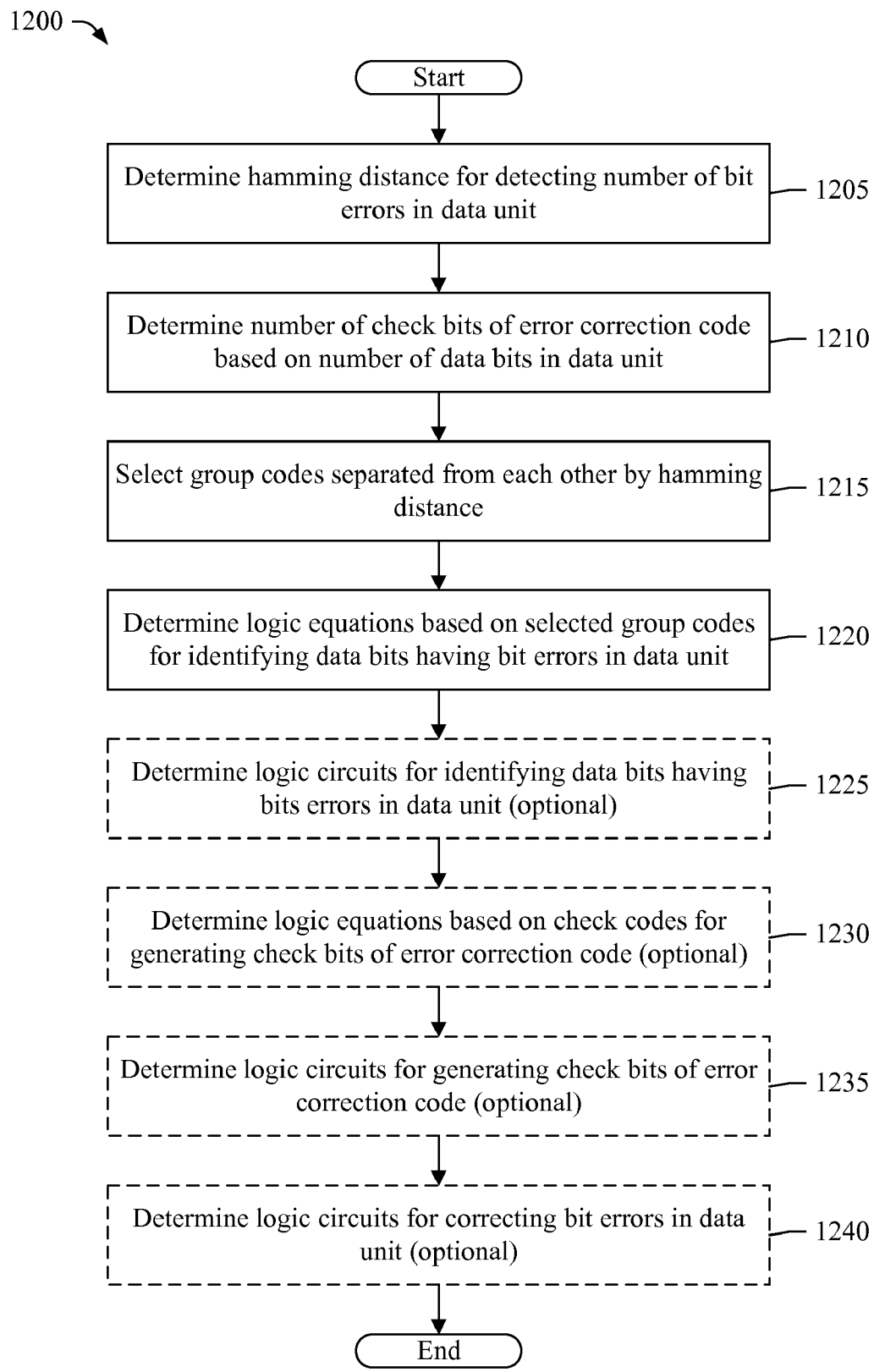
FIG. 12 is a flow chart for a method of detecting bit errors in a data unit, in accordance with an embodiment of the present invention.

FIG. 12 illustrates a method 1200 of detecting bit errors in a data unit, in accordance with an embodiment of the present invention. In step 1205, a hamming distance is determined for detecting a number of bit errors in an input data unit. In one embodiment, the hamming distance is determined based on a number of bit errors to be detected in the input data unit 105 and a number of bit errors to be corrected in the input data unit 105. For example, a hamming distance of two may be selected for detecting double bit errors in the input data unit 105 and correcting single bit errors in the input data unit 105. The method 1200 then proceeds to step 1210.

In step 1210, a number of check bits is determined for an error correction code based on the number of data bits in the input data unit. In one embodiment, the number of check bits in the determined error correction code 115 is determined by selecting a minimum number of check bits needed for detecting the number of bit errors in the input data unit 105. In another embodiment, the number of check bits in the determined error correction code 115 is determined by selecting a number of check bits greater than the minimum number of check bits needed for detecting the number of bit errors in the input data unit 105. For example, the minimum number of check bits may be four and the selected number of check bits may be five. In various embodiments, step 1210 may be performed in conjunction with step 1215 for selecting the number of check bits in the determined error correction code 115. The method 1200 then proceeds to step 1215.

In step 1215, group codes separated from each other by the determined hamming distance are selected. For example, the group codes 310 may be selected by using an electronic device, such as a computing system, to generate the group codes 310. In one embodiment, the group codes 310 have a same population count. In another embodiment, the group codes 310 are selected to minimize population counts in the selected group codes 310.

In another embodiment, a pool of group codes 310 separated from each other by the determined hamming distance is selected. For example, the pool of group codes 310 may be generated by using an electronic device, such as a computing system. Group codes 310 each having the same population count are then selected from the pool of group codes 310. In this way, the selected group codes 310 are separated from each other by the determined hamming distance and have a same population count. In an alternative embodiment, the group codes 310 are selected from the pool of group codes 310 to minimize variance among the population counts of the selected group codes 310. The method 1200 then proceeds to step 1220.

In step 1220, logic equations are determined based on the selected group codes for identifying data bits having bit errors in the input data unit. In one embodiment, a logic equation is determined for each data bit of the input data unit 105 based on the syndrome mask 805 corresponding to the data bit. In this embodiment, the logic equation for each data bit of the input data unit 105 represents an AND operation of the syndrome bits of the syndrome 205 corresponding to data values having a value of one in the syndrome mask 805 corresponding to the data bit. The method 1200 then proceeds to step 1225.

In optional step 1225, logic circuits are determined for identifying data bits having bit errors in the input data unit. In one embodiment, the logic circuits are determined for the error detector 125 based on the logic equations for identifying bit errors in the input data unit 105. In some embodiments, the logic equations for identifying bit errors in the input data unit 105 are expressed in a computing code by using a hardware description language, such as Verilog, and the logic circuits are synthesized based on the computing code by using a logic circuit synthesis tool, such as Design Compiler. The method 1200 then proceeds to step 1230.

In optional step 1230, logic equations are determined based on check codes for generating check bits of the error correction code. In one embodiment, a logic equation is determined for each check bit of the determined error correction code 115 based on the check code 305 corresponding to the check bit. In this embodiment, the logic equation for each check bit represents an exclusive OR operation on the data bits of the input data unit 105 corresponding to data values having a value of one in the corresponding check code 305. The method 1200 then proceeds to step 1235.

In optional step 1235, logic circuits are determined for generating check bits of the determined error correction code. In one embodiment, the logic circuits are determined for the error correction code generator 110 based on the logic equations for generating check bits of the determined error correction code 115. In some embodiments, the logic equations for generating check bits of the determined error correction code 115 are expressed in a computing code by using a hardware description language, such as Verilog, and the logic circuits are synthesized based on the computing code by using a logic circuit synthesis tool, such as Design Compiler. The method 1200 then proceeds to step 1240.

In optional step 1240, logic circuits are determined for correcting bit errors in the input data unit. In one embodiment, each of the logic circuits represents an exclusive OR operation on a data bit of the input data unit 105 and the data bit error indicator corresponding to the data bit in the error indicator 135. In some embodiments, the logic equations for correcting bit errors in the input data unit 105 are expressed in a computing code by using a hardware description language, such as Verilog, and the logic circuits are synthesized based on the computing code by using a logic circuit synthesis tool, such as Design Compiler. The method 1200 then ends.

In various embodiments, the step 1205-1240 of the method 1200 may be performed in a different order than that described herein and illustrated in FIG. 12. In various embodiments, the method 1200 may include more or fewer than steps 1205-1240. In some embodiments, two or more of the steps 1205-1240 may be performed in parallel or substantially simultaneously. In some embodiments, some of the steps 1205-1240 may be performed repeatedly, or in an iterative manner, as is described more fully herein.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:
1. A method comprising:
   determining a hamming distance for detecting a number of bit errors in a data unit comprising a number of data bits;
   determining a number of check bits of an error correction code based on the number of data bits for detecting up to the number of bit errors in the data unit;
   selecting a first plurality of group codes separated from each other by the hamming distance for generating the error correction code, each group code of the first plurality of group codes comprising a plurality of data val- ues and a same population count indicating a number of data values having a same logic state in the group code; and determining a first plurality of logic equations based on the first plurality of group codes for identifying at least one data bit having a bit error in the data unit based on a syndrome of the error correction code.

2. The method of claim 1, wherein determining the first plurality of logic equations comprises determining a plurality of syndrome masks corresponding to the first plurality of group codes, each syndrome mask of the plurality of syndrome masks comprising both a data value having the same logic state and corresponding to a data bit having the same logic state in the corresponding group code and a data value having an indeterminate logic state and corresponding to a data value not having the same logic state in the corresponding group code.

3. The method of claim 2, further comprising determining a plurality of logic circuits based on the first plurality of logic equations, each logic circuit of the plurality of logic circuits configured to detect a bit error in a corresponding data bit of the data unit based on the syndrome.

4. The method of claim 1, wherein the first plurality of group codes comprises a plurality of check codes each comprising a data value of each group code of the first plurality of group codes and a population count indicating a number of data values in the check code having the same logic state, the method further comprising determining a second plurality of logic equations based on the plurality of check codes for generating a plurality of check bits of the error correction code.

5. The method of claim 4, wherein selecting the first plurality of group codes separated from each other by the hamming distance further comprises minimizing a variance among the population counts of the plurality of check codes.

6. The method of claim 4, wherein determining the number of check bits of the error correction code comprises:
   determining a minimum number of check bits needed for detecting the number of bit errors based on the number of data bits in the data unit; and
   selecting a number of check bits greater than the minimum number of check bits so that each group code of the first plurality of group codes has the same population count.

7. The method of claim 4, wherein selecting the first plurality of group codes separated from each other by the hamming distance comprises:
   determining a second plurality of group codes separated from each other by the hamming distance; and
   selecting the first plurality of group codes from the second plurality of group codes so that each group code of the first plurality of group codes has the same population count.

8. The method of claim 7, wherein selecting the first plurality of group codes from the second plurality of group codes further comprises minimizing a variance among the population counts of the plurality of check codes.

9. The method of claim 7, further comprising determining a plurality of logic circuits based on the second plurality of logic equations, each logic circuit of the plurality of logic circuits configured to generate a check bit of the error correction code and having a propagation delay for generating the check bit, wherein selecting the first plurality of group codes from the second plurality of group codes comprises minimizing the propagation delays of the plurality of logic circuits.

10. A method comprising:
    determining a minimum hamming distance for detecting a number of bit errors in a data unit comprising a number of data bits;
    determining a number of check bits of an error correction code based on the number of data bits for detecting up to the number of bit errors in the data unit;
    determining a first plurality of group codes separated from each other by the minimum hamming distance, each group code of the first plurality of group codes comprising a plurality of data values and a population count indicating a number of data values having a same logic state in the group code;
    selecting a second plurality of group codes from the first plurality of group codes for generating the error correction code so that a variance among the population counts of the second plurality of group codes is minimized, the second plurality of group codes further comprising a plurality of check codes, each check code of the plurality of check codes comprising a data value of each group code of the second plurality of group codes and a population count indicating a number of data values in the check code having the same logic state; and
    determining a first plurality of logic equations based on the second plurality of group codes for identifying at least one data bit having a bit error in the data unit based on a syndrome of the error correction code.

11. The method of claim 10, wherein selecting the second plurality of group codes from the first plurality of group codes further comprises minimizing a variance among the population counts of the plurality of check codes.

12. The method of claim 10, wherein each group code of the second plurality of group codes has a same population count.

13. The method of claim 12, wherein determining the first plurality of logic equations comprises determining a plurality of syndrome masks corresponding to the second plurality of group codes, each syndrome mask of the plurality of syndrome masks comprising both a data value having the same logic state and corresponding to a data bit having the same logic state in the corresponding group code and a data value having an indeterminate logic state corresponding to a data bit not having the same logic state in the corresponding group code.

14. The method of claim 13, further comprising determining a plurality of logic circuits based on the first plurality of logic equations, each logic circuit of the plurality of logic circuits configured to detect a bit error in a corresponding data bit of the data unit based on the syndrome.

15. The method of claim 13, wherein selecting the second plurality of group codes from the first plurality of group codes comprises minimizing the population counts of the plurality of check codes.

16. The method of claim 13, further comprising:
    determining a second plurality of logic equations based on the plurality of check codes for generating a plurality of check bits of the error correction code; and
    determining a plurality of logic circuits based on the second plurality of logic equations, each logic circuit of the plurality of logic circuits configured to generate a check bit of the error correction code and having a propagation delay for generating the check bit, wherein selecting the second plurality of group codes from the first plurality of group codes comprises minimizing the propagation delays of the plurality of logic circuits.

17. A system comprising:
    an error correction code generator configured to generate a first error correction code comprising a number of check bits based on a data unit, the error correction code generator comprising a first plurality of logic circuits for generating the check bits in the first error correction code; and an error detector coupled to the error correction code generator and configured to generate a syndrome having a number of syndrome bits based on the first error correction code and a second error correction code, the error detector comprising a second plurality of logic circuits each having a number of inputs being less than the number of check bits of the first error correction code for receiving at least one syndrome bit of the syndrome, each logic circuit of the second plurality of logic circuits configured to indicate whether a corresponding data bit in the data unit has a bit error.

18. The system of claim 17, wherein each logic circuit of the second plurality of logic circuits has a same number of inputs for receiving a same number of syndrome bits of the syndrome.

19. The system of claim 18, wherein each logic circuit of the first plurality of logic circuits has a same number of inputs for receiving a same number of data bits of the data unit.

20. The system of claim 17, further comprising an error corrector coupled to the error detector and configured to correct at least one bit error in the data unit.

21. The system of claim 17, wherein each logic circuit of the second plurality of logic circuits is further configured to determine whether the data bit corresponding to the logic circuit has a bit error by determining each syndrome bit received at the inputs of the logic circuit has a same logic state.

22. A method comprising:
generating a first error correction code having a number of check bits based on a data unit;
generating a syndrome comprising a number of syndrome bits based on the first error correction code and a second error correction code, the number of syndrome bits in the syndrome being the same as the number of check bits in the first error correction code; and
generating a bit error indictor based on a plurality of syndrome bits of the syndrome for detecting a bit error in the data unit, the plurality of syndrome bits having a number of syndrome bits being less than the number of check bits in the first error correction code.

23. The method of claim 22, further comprising correcting the bit error in the data unit based on the bit error indicator.

24. The method of claim 22, further comprising generating a plurality of bit error indicators for detecting a plurality of bit errors in the data unit, each bit error indicator of the plurality of bit error indicators being generated based on a corresponding plurality of syndrome bits of the syndrome, each plurality of syndrome bits having a same number of syndrome bits being less than the number of check bits.

25. The method of claim 24, wherein generating the plurality of bit error indicators comprises generating each bit error indicator of the plurality of bit error indicators by determining each syndrome bit of the plurality of syndrome bits corresponding to the bit error indicator has a same logic state.

* * * * *

UNITED STATES PATENT AND TRADEMARK OFFICE
CERTIFICATE OF CORRECTION

PATENT NO.           : 8,069,392 B1                               Page 1 of 1
APPLICATION NO.      : 11/873357
DATED                : November 29, 2011
INVENTOR(S)          : Christopher I. W. Norrie It is certified that error appears in the above-identified patent and that said Letters Patent is hereby corrected as shown below:

Column 11, line 5, "100 ul" should read --10011--

Column 11, line 24 "100 ul" should read --10011--

Signed and Sealed this
Twentieth Day of March, 2012

David J. Kappos
*Director of the United States Patent and Trademark Office*